United States Patent
Thakur

(10) Patent No.: US 6,806,572 B2
(45) Date of Patent: Oct. 19, 2004

(54) STRUCTURE FOR CONTACT FORMATION USING A SILICON-GERMANIUM ALLOY

(75) Inventor: Randhir P. S. Thakur, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/277,688

(22) Filed: Oct. 22, 2002

(65) Prior Publication Data

US 2003/0057555 A1 Mar. 27, 2003

Related U.S. Application Data

(62) Division of application No. 09/592,958, filed on Jun. 13, 2000, now Pat. No. 6,469,388, which is a continuation of application No. 09/031,991, filed on Feb. 27, 1998, now Pat. No. 6,075,291.

(51) Int. Cl.[7] .......................... H01L 23/34; H01L 29/43
(52) U.S. Cl. ........................ 257/751; 257/774; 257/758; 257/754; 257/767; 257/768; 257/915; 257/616; 257/742; 257/743; 365/129
(58) Field of Search ................................ 257/751, 758, 257/700, 701, 754, 767, 768, 770, 774, 773, 680, 915, 616, 743, 742; 365/129

(56) References Cited

U.S. PATENT DOCUMENTS

| | | | |
|---|---|---|---|
| 4,432,132 A | 2/1984 | Kinsbron et al. ............. 29/571 |
| 4,868,138 A | 9/1989 | Chan et al. ..................... 437/44 |
| 5,108,954 A | 4/1992 | Sandhu et al. .............. 437/200 |
| 5,126,805 A | 6/1992 | Bulat et al. ..................... 357/22 |
| 5,242,847 A | 9/1993 | Ozturk et al. ................. 437/41 |
| 5,541,137 A | 7/1996 | Manning et al. ............ 437/162 |
| 5,563,448 A | * 10/1996 | Lee et al. .................... 257/742 |
| 5,596,522 A | 1/1997 | Ovshinsky et al. ......... 365/113 |
| 5,644,166 A | * 7/1997 | Honeycutt et al. .......... 257/754 |
| 6,022,798 A | 2/2000 | Sumi et al. ................. 438/637 |
| 6,071,810 A | 6/2000 | Wada et al. ................ 438/635 |
| 6,194,304 B1 | 2/2001 | Morozumi et al. |
| 6,238,967 B1 | 5/2001 | Shiho et al. |
| 6,294,461 B1 | * 9/2001 | Thakur ....................... 436/637 |

OTHER PUBLICATIONS

Aubrey, V.., et al., "Schottky Barrier Heights of W on Si (1-x)Ge(x) Alloys", *Appl. Phys. Lett.*, 63, (Nov. 1993), 2520–2522.

Chieh, Y.., et al., "Low–Resistance Bandgap–Engineered W/Si(1-x)Ge(x)/Si Contacts", *IEEE Electron Device Letters*, 17, (Jul. 1996),360–362.

Grider, D..,et al., "Ultra–Shallow Junction Formation by Diffusion from Polycrystalline Si(x)Ge(1-x) Alloys", *ULSI Science and Tedchnology : Proc. 3rd Int'l Symp. on Ultra Large Scale Integration Science and Technology*, J.M. Andrews, et al., eds.,(1991),296–304.

* cited by examiner

*Primary Examiner*—Alexander Oscar Williams
(74) *Attorney, Agent, or Firm*—Schwegman, Lundberg, Woessner & Kluth, P.A.

(57) ABSTRACT

A new method and structure for an improved contact using doped silicon is provided. The structures are integrated into several higher level embodiments. The improved contact has low contact resistivity. Improved junctions are thus provided between an IGFET device and subsequent metallization layers. The improvements are obtained through the use of a silicon-germanium (Si—Ge) alloy. The alloy can be formed from depositing germanium onto the substrate and subsequently annealing the contact or by selectively depositing the preformed alloy into a contact opening. The above advantages are incorporated with relatively few process steps.

20 Claims, 6 Drawing Sheets

STRUCTURE FOR CONTACT FORMATION USING A SILICON-GERMANIUM ALLOY

This application is a Divisional of U.S. application Ser. No. 09/592,958, filed Jun. 13, 2000 now U.S. Pat. No. 6,469,388 which is a Continuation of U.S. application Ser. No. 09/031,991, filed Feb. 27, 1998, now U.S. Pat. No. 6,075,291.

FIELD OF THE INVENTION

The present invention relates generally to semiconductor integrated circuits. More particularly, it pertains to a method and structure for contact formation using doped silicon.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by an insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Once formed IGFETs must be wired together in order to complete functional circuits. The materials, methods, and processes of "wiring" the component parts together is generally referred to as metallization. Prior to the development of very large scale integration (VLSI)-level circuits, the primary metallization material was pure aluminum (Al). Today's metallization processes, however, have evolved from the simple one level pure aluminum process.

Several objectives have influenced IGFET design and fabrication changes. These include; a drive for increased circuit density, an increase in the number of surface layers, and the miniaturization of individual components. The miniaturization of individual components equates to placing a greater number of IGFETs on a single chip. This in turn produces increased circuit density and yields greater functionality per chip. A further objective is to improve the performance, and particularly the speed, of the IGFET transistors. This pursuit is manifested by shorter conduction channel lengths and through efforts to obtain low contact resistivity at the IGFET junctions. These aspects offer increased IGFET speed and allow for a greater number of operations to be performed by the IGFET in less time. IGFETs are used in great quantity in computers where the push to obtain higher operation cycle speeds demands faster IGFET performance. In these efforts, it is desirable to keep costly IGFET fabrication steps to a minimum.

Contact resistance between the IGFET and different metallization layers presents a particularly difficult hurdle for further IGFET design evolution. The contact resistance is influenced by the materials, the substrate doping and the contact dimensions. The contact dimensions are typically referred to as the aspect ratio of the contact. The aspect ratio is given by the equation: Aspect Ratio=(Width of the opening)/(the Height of the opening), (AR=W/T). The smaller the contact size or the higher the aspect ratio of the contact opening, the higher the resistance. Modern dynamic random access memory (DRAM) design often necessitates IGFETs to be formed with high aspect ratio contact openings to accommodate other components of the device. The cumulative effect of all the individual contact resistances can dominate the conductivity of the metal system. In effect, contact resistance has become the dominant factor in ultra large scale integration (ULSI) metal system performance. Aluminum-silicon (Al—Si) contact resistance, along with its concomitant problems of electromigration and eutectic alloying have led to investigation of other contact materials for use in VLSI and ULSI metallization.

A continual need exists for creating improved junctions between the IGFET structures and subsequent metallization layers. Thus, it is desirable to uncover new material combinations and methods for processing the same which will reduce the contact resistivity between the IGFET device and subsequent metallization layers. Further, a method is desirable to achieve the above mentioned results while keeping costly fabrication steps to a minimum.

SUMMARY OF THE INVENTION

A method for forming a contact using doped silicon is provided. The method includes forming a contact opening in a surface layer on a silicon substrate. Then, a first contact material is deposited on and within the contact opening. A barrier metal is deposited on the first contact material. The method further includes annealing the contact and then depositing a second contact material on the barrier metal. In one embodiment, the first contact material is germanium (Ge) which is deposited to form an alloy with the silicon substrate.

In another embodiment, a device is provided which includes a contact formed of doped silicon. The device includes a contact opening within a surface layer on a silicon substrate. A first contact material is formed on and within the contact opening. The first contact material forms an alloy with the silicon substrate. A barrier metal couples to the first contact material. And, a second contact material couples to the barrier metal. The first contact material comprises germanium (Ge).

In another embodiment, an information handling system is provided. The information handling system includes; a central processing unit, a random access memory, and a system bus which communicatively couples the central processing unit to the random access memory. The information handling system further includes a contact formed of doped silicon. The contact has a contact opening within a surface layer on a silicon substrate. A first contact material is formed on and within the contact opening and the first contact material forms an alloy with the silicon substrate. A barrier metal couples to the first contact material. A second contact material coupling to the barrier metal.

In an alternative embodiment, a method for forming a contact is provided. The method includes forming a high aspect ratio contact opening in a surface layer on a silicon substrate. the surface layer is borophosphorus silicate glass (BPSG). An alloy material is deposited on and within the contact opening to reduce the aspect ratio of the contact opening. The method includes depositing an alloy of silicon-germanium (Si—Ge). Next, a barrier metal is deposited on the alloy material. And, finally a further contact material is deposited on the barrier metal.

In another embodiment, a device is provided, the device having a high aspect ratio contact opening within a surface layer on a silicon substrate. The device further includes, an alloy material formed on and within the contact opening to reduce the aspect ratio of the contact opening. There is a barrier metal coupling to the alloy material. And, a contact material couples to the barrier metal.

An alternative embodiment provides for an integrated circuit which has a central processing unit, a random access memory, a system bus which communicatively couples the central processing unit and the random access memory, and the device just previously recited.

Another embodiment, provides a method for forming a contact including forming a high aspect ratio contact opening in a surface layer on a silicon substrate, forming an oxide layer on and within the contact opening in the surface layer, and depositing an alloy material on the oxide layer and within the contact opening to reduce the aspect ratio of the contact opening.

In an alternative embodiment, a device is provided having a contact opening in a surface layer on a silicon substrate, an oxide layer on and within the contact opening in the surface layer; and an alloy material on the oxide layer and within the contact opening such that the aspect ratio of the contact opening is reduced.

Another embodiment, provides a method for forming a contact including forming a contact opening in a surface layer on a silicon substrate, forming an oxide layer on and within the contact opening in the surface layer, and depositing a germanium (Ge) contact within the contact opening in the silicon substrate and annealing to form an alloy with the substrate.

In an alternative embodiment, a device is provided having a contact opening in a surface layer on a silicon substrate, an oxide layer on and within the contact opening in the surface layer; and a germanium (Ge) contact formed within the contact opening in the silicon substrate. The germanium (Ge) contact forms an alloy with the silicon substrate.

Thus various embodiments are provided for fabricating a contact which result in multiple new structures. The structures are integrated into several higher level embodiments. The improved contact has low contact resistivity. Improved junctions are thus provided between an IGFET device and subsequent metallization layers. The improvements are obtained through various steps and structures laid forth in the detailed description. The above advantages are incorporated with relatively few process steps.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Method of Fabrication

Figure 1A:
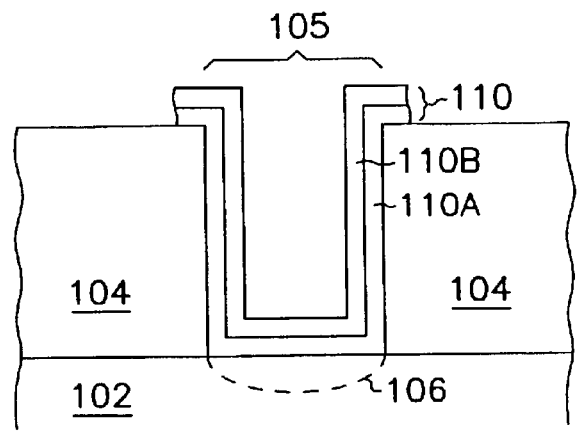
FIGS. 1A, 1B and 1C show a cross-sectional view of process steps for making a contact formation using doped silicon in accordance with an embodiment of the invention.
Figure 1B:
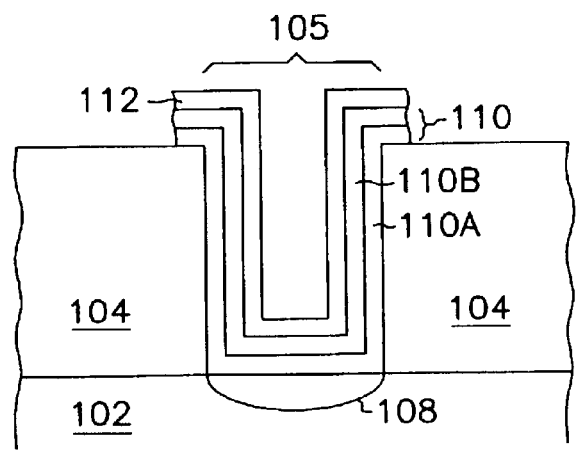
Figure 1C:
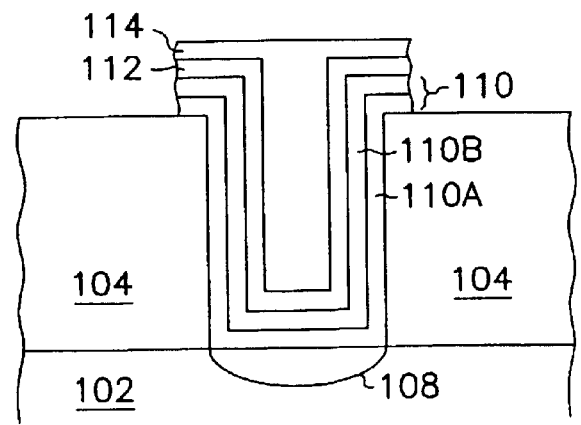

FIGS. 1A–1C illustrate generally the various processing techniques of one embodiment of a contact formation using doped silicon.

FIG. 1A illustrates the structure at the point where transistor fabrication has been completed up through covering source/drain regions with an insulator surface layer. This stage in the fabrication may be reached in a number of well known steps which do not comprise the thrust of the present invention. These processing steps are not repeated herein.

In FIG. 1A a surface layer 104 is shown on a substrate 102. The substrate 102 is an epitaxial layer suitable for integrated circuit manufacture. In one embodiment the substrate 102 is a P-type substrate with a boron background concentration on the order of $1 \times 10^{16}$ atoms/cm$^3$, a <100> orientation and a resistivity of 12 ohm-cm. The epitaxial surface layer of the substrate 102 is disposed on a P+ base layer (not shown) and includes a planar top surface. In an alternative embodiment, the substrate 102 is an N-type substrate on an N+ base layer. The surface layer 104 is an isolation layer and can be formed of any suitable dielectric material. In one embodiment, surface layer 104 is silicon-dioxide ($SiO_2$). In another embodiment, the surface layer 104 is formed of silicon nitride ($Si_3N_4$). A photoresist (not shown) is applied to the surface layer and selectively exposed to reveal the region where a contact is to be formed. The surface layer 104 is then removed from this region forming a contact opening 105. In one embodiment, the contact opening 105 is formed over a source/drain region of an IGFET. The surface layer 104 is removed by any suitable etching technique. In one embodiment, the surface layer 104 is removed using a wet etch process, such as a buffered oxide etch (BOE). In an alternative embodiment, the surface layer 104 is removed using a dry etch process, such as reactive ion etching (RIE). Next, a first contact material 106 is deposited on and within the contact opening 105. The first contact material 106 is deposited by an ion implantation method. In one embodiment, first contact material 106 is germanium (Ge).

Next, the photoresist is stripped using conventional photoresist stripping techniques. A barrier metal 110 is deposited on the first contact material 106. The barrier metal is deposited using any suitable technique, such as by chemical vapor deposition (CVD). In one embodiment, the barrier metal 110 is a titanium-nitride (TiN)/titanium (Ti) layer. A layer of titanium (Ti) 110A is deposited beneath the titanium-nitride (TiN) layer 110B to provide a high-conductivity intermediate layer with the silicon substrate 102. In an alternate embodiment, the titanium (Ti) layer 110A is deposited prior to depositing the first contact material 106. Then, in a subsequent step the first contact material 106 is deposited into the substrate 102 by ion implantation. The structure is now as appears in FIG. 1A.

FIG. 1B illustrates the structure following the next sequence of process steps. A high temperature rapid thermal anneal (RTA) is performed. As those skilled in the art will appreciate, this process cures out the crystal damage induced by the previous ion implantation process. Additionally, the annealing process forms an alloy 108 between the first contact material 106 and the silicon substrate 102. A second contact material 112 is deposited on the barrier metal 110. The second contact material 112 is deposited by any suitable method, such as by low pressure chemical vapor deposition (LPCVD). In one embodiment, the second contact material 112 is a refractory metal. In an alternate embodiment, the second contact material 112 is any material which possesses a sufficiently low contact resistivity. The structure is now as appears in FIG. 1B.

FIG. 1C illustrates the structure following the final sequence of process steps. A third contact material 114 is deposited on the second contact material 112. The third contact material is deposited by any suitable technique, such as by chemical vapor deposition (CVD). In one embodiment, the third contact material is aluminum (Al). The final structure is as shown in FIG. 1C. Additional metallization layers and accompanying contact formation, not included here, are achieved using conventional techniques. These further processing steps are not repeated herein. Likewise, the principal processing steps disclosed herein may be combined with other steps apparent to those skilled in the art.

Figure 2:
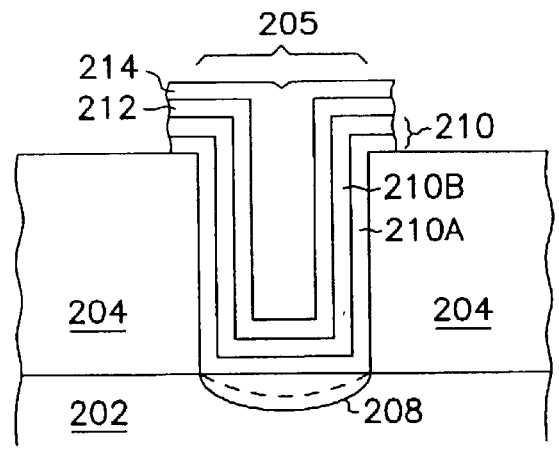
FIG. 2 illustrates the completed contact structure in accordance with an embodiment of the invention.

The present invention includes numerous variations to the embodiment described above. For instance, the completed device illustrated in FIG. 2 is one embodiment of the invention formed on a top surface of a semiconductor substrate 202. FIG. 2 is a cross sectional view wherein a surface layer 204 is shown on a silicon substrate 202 and a contact opening 205 is formed within the surface layer 204 on the substrate 202. The surface layer 204 is an isolation layer and can be formed of any suitable dielectric material. In one embodiment, surface layer 204 is silicon-dioxide ($SiO_2$). In another embodiment, the surface layer 204 is formed of silicon nitride ($Si_3N_4$). A first contact material 208 is formed on and within the contact opening 205. The first contact material 208 is an alloy formed with the silicon substrate 202. In one embodiment, the first contact material 208 is germanium (Ge). A barrier metal 210 couples to the first contact material 208. In one embodiment, the barrier metal 210 comprises a layer of titanium (Ti) 210A topped by a layer of titanium-nitride (TiN) 210B. In one embodiment, the first contact material 208 alloy is formed prior to forming the barrier metal 210. In an alternate embodiment, the first contact material 208 is formed subsequent to forming the barrier metal 210. A second contact material 212 is couples to the barrier metal 210. In one embodiment, the second contact material 212 is a refractory metal. A third contact material 214 couples to the second contact material 212. In one embodiment, the third contact material is aluminum (Al).

Figure 3:
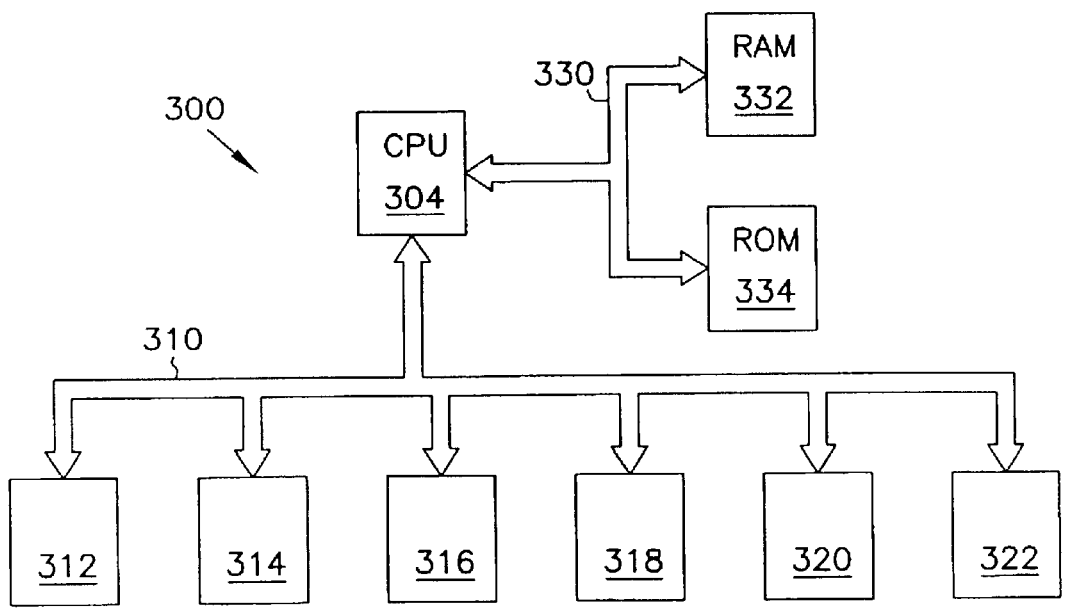
FIG. 3 is a block diagram of an information handling system to incorporate an embodiment of the invention.

Thus the invention provides a method and structure for a contact formation using doped silicon. The contact formation provides low contact resistivity. Advantageously, the invention is well-suited for use in a device such as an integrated circuit chip, as well as an electronic system including a microprocessor, a memory and a system bus. The electronic system may also be an information handling system 300 as shown in FIG. 3. The information handling system includes a central processing unit (CPU) 304, a random access memory (RAM) 332, a read only memory (ROM) 334, and a system bus 330 for communicatively coupling the CPU 304, the RAM 332 and the ROM 334. The system 300 also includes an input/output bus 310 and several peripheral devices, such as 312, 314, 316, 318, 320, and 322. The device peripherals attach to the input output bus 310. Peripheral devices include hard disk drives, floppy disk drives, monitors, keyboards and other such peripherals. The information handling system 300 includes a contact formation, such as is shown in FIG. 2, in the CPU 304, the RAM 332 and the ROM 334. The contact formation provides a low contact resistivity at the junctions between an IGFET device and subsequent metallization layers. The low contact resistivity provides for stronger and more reliable electronic coupling, thus facilitating better data flow throughout the information handling system.

Figure 4A:
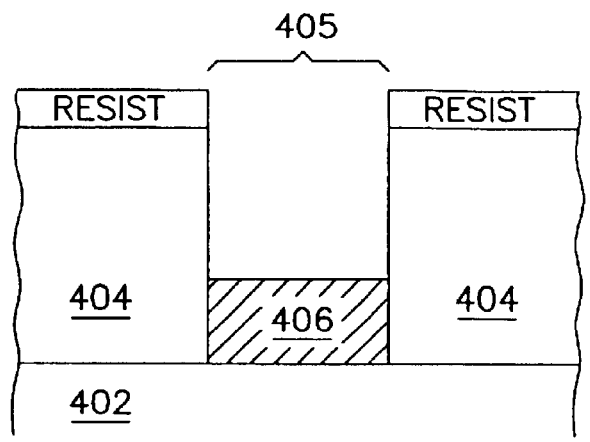
FIGS. 4A, 4B and 4C show a cross-sectional view of process steps for making a contact formation using doped silicon in accordance with another embodiment of the invention.
Figure 4B:
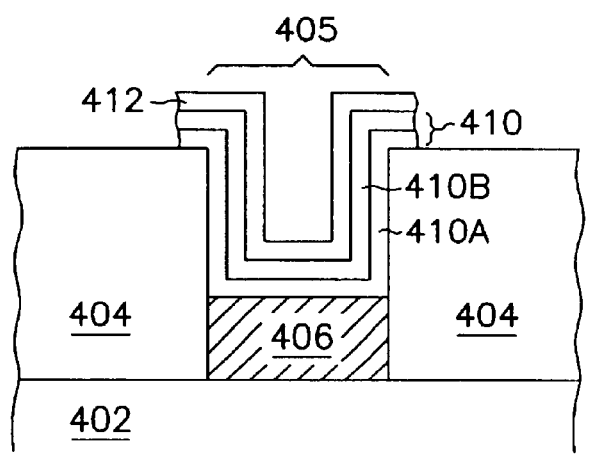
Figure 4C:
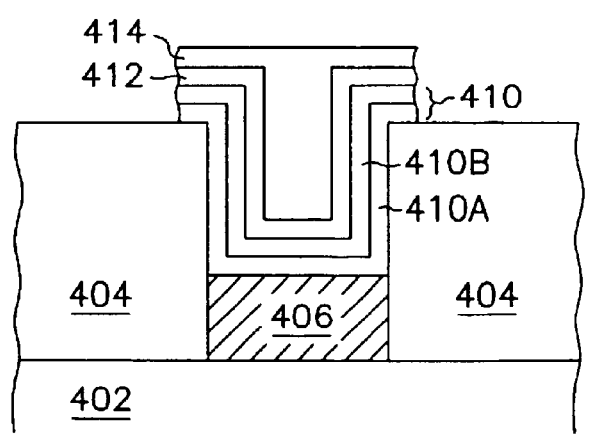

FIGS. 4A–4C illustrate generally the various processing techniques of another embodiment of a contact formation using doped silicon, according to the teachings of the present invention.

In FIG. 4A illustrates the structure at the point where transistor fabrication has been completed up through covering source/drain regions a insulator surface layer. This stage in the fabrication may be reached in a number of well known steps which do not comprise the thrust of the present invention. These processing steps are not repeated herein.

In FIG. 4A a surface layer 404 is shown on a substrate 402. The substrate 402 is an epitaxial layer suitable for integrated circuit manufacture. In one embodiment the substrate 402 is a P-type substrate with a boron background concentration on the order of $1 \times 10^{16}$ atoms/cm$^3$, a <100> orientation and a resistivity of 12 ohm-cm. The epitaxial surface layer of the substrate 402 is disposed on a P+ base layer (not shown) and includes a planar top surface. In an alternative embodiment, the substrate 402 is an N-type substrate on an N+ base layer. The surface layer 404 is an isolation layer and can be formed of any suitable dielectric material. In one embodiment, surface layer 404 is borophosphorus silicate glass (BPSG). A photoresist (not shown) is applied to the surface layer 404 and selectively exposed to reveal the region where a contact is to be formed. The surface layer 404 is then removed from this region forming a high aspect ratio contact opening 405. In one embodiment, the high aspect ratio contact opening 405 is formed over a source/drain region of an IGFET. The surface layer 404 is removed by any suitable etching technique. In one embodiment, the surface layer 404 is removed using a wet etch process, such as a buffered oxide etch (BOE). In an alternative embodiment, the surface layer 404 is removed using a dry etch process, such as reactive ion etching (RIE). Next, an alloy material 406 is deposited on and within the contact opening 405 to reduce the aspect ratio of the contact opening 405. The alloy material 406 is deposited by an ion implantation method. In one embodiment, the alloy material 406 is deposited by low temperature epitaxial deposition. In one embodiment, the alloy material 406 is a silicon-germanium (Si—Ge) alloy. The structure is now as appears in FIG. 4A.

FIG. 4B illustrates the structure following the next sequence of process steps. The photoresist is stripped using conventional photoresist stripping techniques. A barrier metal 410 is deposited on the alloy material 406. The barrier metal 410 is deposited using any suitable technique, such as by chemical vapor deposition (CVD). In one embodiment, the barrier metal 410 is a titanium-nitride (TiN)/titanium (Ti) layer. A layer of titanium (Ti) 410A is deposited beneath the titanium-nitride (TiN) layer 410B to provide a high-conductivity intermediate layer with the alloy material 406. A first contact material 412 is deposited on the barrier metal 410. The first contact material 412 is deposited by any suitable method, such as by low pressure chemical vapor deposition (LPCVD). In one embodiment, the first contact material 412 is a refractory metal. In an alternate embodiment, the first contact material 412 is any material which possesses a sufficiently low contact resistivity. The structure is now as appears in FIG. 4B.

FIG. 4C illustrates the structure following the final sequence of process steps. A second contact material 414 is deposited on the first contact material 412. The second contact material 414 is deposited by any suitable technique, such as by chemical vapor deposition (CVD). The final structure is as shown in FIG. 4C. Additional metallization layers and accompanying contact formation, not included here, are achieved using conventional techniques. These further processing steps are not repeated herein. Likewise, the principal processing steps disclosed herein may be combined with other steps apparent to those skilled in the art.

Figure 5:
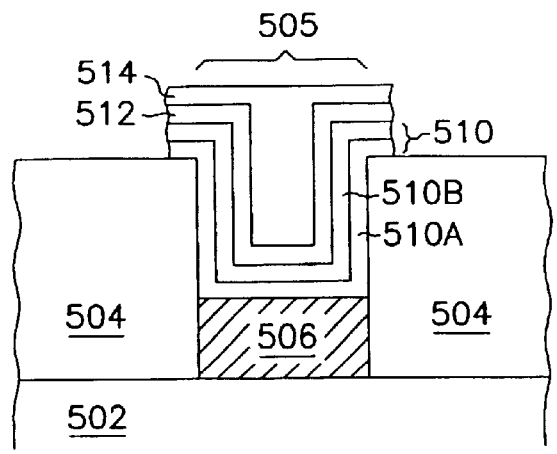
FIG. 5 illustrates the completed contact structure in accordance with another embodiment of the invention.

The present invention includes numerous variations to the embodiment described above. For instance, the completed device illustrated in FIG. 5 is one embodiment of the invention formed on a top surface of a semiconductor substrate 502, according to the method taught in FIGS. 4A through 4C. FIG. 5 is a cross sectional view wherein a surface layer 504 is shown on a silicon substrate 502 and a high aspect ratio contact opening 505 is formed within the surface layer 504 on the substrate 502. The surface layer 504 is an isolation layer and can be formed of any suitable dielectric material. In one embodiment, surface layer 504 is borophosphorus silicate glass (BPSG). An alloy material 506 is formed on and within the contact opening 505 to reduce the aspect ratio of the contact opening 505. The alloy material 506 is formed by an ion implantation method. In one embodiment, the alloy material 506 is formed by low temperature epitaxial deposition. In one embodiment, the alloy material 506 is formed of silicon-germanium (Si—Ge). A barrier metal 510 couples to the alloy material 506. In one embodiment, the barrier metal 510 comprises a layer of titanium (Ti) 510A topped by a layer of titanium-nitride (TiN) 510B. A first contact material 512 couples to the barrier metal 510. A second contact material 514 couples to the first contact material 512.

Figure 6:
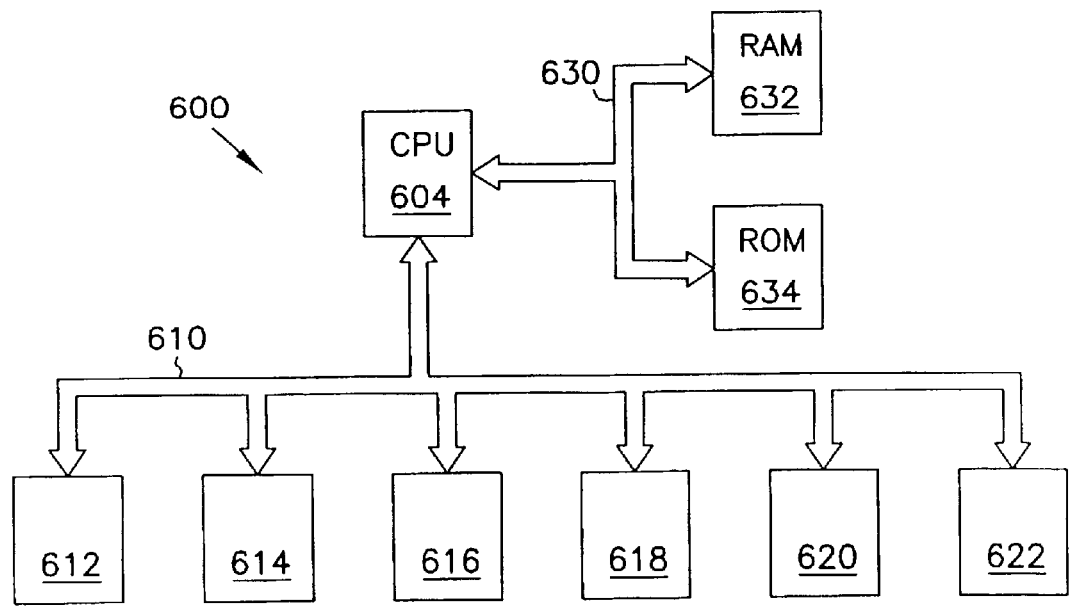
FIG. 6 is a block diagram of an integrated circuit to incorporate an embodiment of the invention.

Thus the invention provides a method and structure for a contact formation using doped silicon. The contact formation provides low contact resistivity. Advantageously, the invention is well-suited for use in a device such as an integrated circuit chip, as well as an electronic system including a microprocessor, a memory and a system bus. The electronic system may also include an integrated circuit 600 as shown in FIG. 6. The information handling system includes a central processing unit (CPU) 604, a random access memory (RAM) 632, a read only memory (ROM) 634, and a system bus 630 for communicatively coupling the CPU 604, the RAM 632 and the ROM 634. The system 600 also includes an input/output bus 610 and several devices peripheral devices, such as 612, 614, 616, 618, 620, and 622. The device peripherals attach to the input output bus 610. Peripheral devices include hard disk drives, floppy disk drives, monitors, keyboards and other such peripherals. The information handling system 600 includes a contact formation, such as is shown in FIG. 5, in the CPU 604, the RAM 632 and the ROM 634. The contact formation provides a low contact resistivity at the junctions between an IGFET device and subsequent metallization layers. The low contact resistivity provides for stronger and more reliable electronic coupling, thus facilitating better data flow throughout the integrated circuit.

Figure 7A:
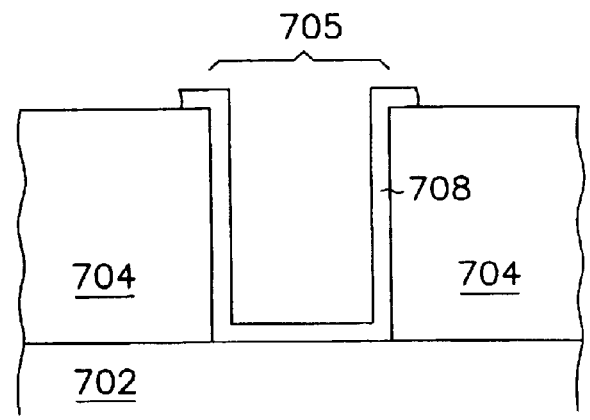
FIGS. 7A and 7B shows a cross-sectional view of process steps for making a contact formation using doped silicon in accordance with another embodiment of the invention.
Figure 7B:
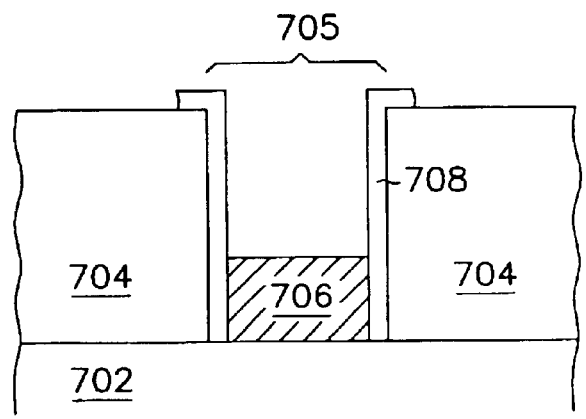

FIGS. 7A–7B illustrate generally the various processing techniques of another embodiment of a contact formation using doped silicon.

FIG. 7A illustrates the structure at the point where transistor fabrication has been completed up through covering source/drain regions with an insulator surface layer. This stage in the fabrication may be reached in a number of well known steps which do not comprise the thrust of the present invention. These processing steps are not repeated herein.

In FIG. 7A a surface layer 704 is shown on a substrate 702. The substrate 702 is an epitaxial layer suitable for integrated circuit manufacture. In one embodiment the substrate 702 is a P-type substrate with a boron background concentration on the order of $1\times10^{16}$ atoms/cm$^3$, a <100> orientation and a resistivity of 12 ohm-cm. The epitaxial surface layer of the substrate 702 is disposed on a P+ base layer (not shown) and includes a planar top surface. In an alternative embodiment, the substrate 702 is an N-type substrate on an N+ base layer. The surface layer 704 is an isolation layer and can be formed of any suitable dielectric material. In one embodiment, surface layer 704 is borophosphorus silicate glass (BPSG). A photoresist (not shown) is applied to the surface layer and selectively exposed to reveal the region where a contact is to be formed. The surface layer 704 is then removed from this region forming a high aspect ratio contact opening 705. In one embodiment, the contact opening 705 is formed over a source/drain region of an IGFET. The surface layer 704 is removed by any suitable etching technique. In one embodiment, the surface layer 704 is removed using a wet etch process, such as a buffered oxide etch (BOE). In an alternative embodiment, the surface layer 704 is removed using a dry etch process, such as reactive ion etching (RIE). Next, an oxide layer 708 is formed on and within the contact opening 705. The oxide layer 708 can be formed using any suitable technique, such as by thermal growth or chemical vapor deposition. In one embodiment, the oxide layer 708 is formed from tetraethyl orthosilicate (TEOS) sources and the deposition is performed by low pressure chemical vapor deposition (LPCVD). The structure is now as appears in FIG. 7A.

FIG. 7B illustrates the structure following the final sequence of steps. The oxide layer 708 is selectively etched back from the substrate 702 using any suitable process, such as reactive ion etching (RIE). An alloy material 706 is deposited on the oxide layer 708 and within the contact opening 705 to reduce the aspect ratio of the contact opening 705. In one embodiment, the alloy material 706 is a silicon-germanium (Si—Ge) alloy. The alloy material is deposited by an ion implantation method. In one embodiment, the alloy material is deposited by low temperature epitaxial deposition. The structure is now as appears in FIG. 7B. Additional metallization layers and accompanying contact formation, not included here, are achieved using conventional techniques. These further processing steps are not repeated herein. Likewise, the principal processing steps disclosed herein may be combined with other steps apparent to those skilled in the art.

Figure 8:
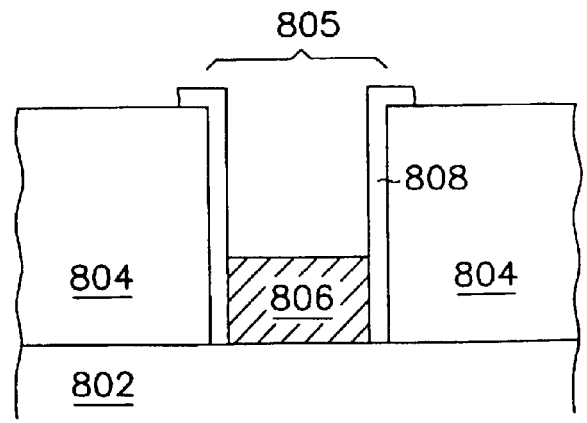
FIG. 8 illustrates the completed contact structure in accordance with another embodiment of the invention.

The present invention includes numerous variations to the embodiment described above. For instance, the completed device illustrated in FIG. 8 is one embodiment of the invention formed, according to the method of FIGS. 7A–7B on a top surface of a semiconductor substrate 802. FIG. 8 is a cross sectional view wherein a surface layer 804 is shown on a silicon substrate 802 and a high aspect ratio contact opening 805 is formed within the surface layer 804 on the substrate 802. The surface layer 204 is an isolation layer and can be formed of any suitable dielectric material. In one embodiment, surface layer 804 is borophosphorus silicate glass (BPSG). An oxide layer 808 is formed on and within the contact opening 805. In one embodiment, the oxide layer 808 is formed from a tetraethyl orthosilicate (TEOS) sources and formed by low pressure chemical vapor deposition (LPCVD). An alloy material 806 is on the oxide layer 808 and within the contact opening 805. In one embodiment, the alloy material 806 is a silicon-germanium (Si—Ge) alloy.

Figure 9A:
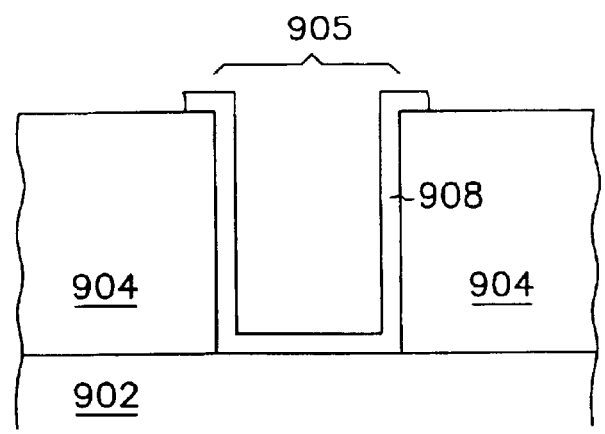
FIGS. 9A and 9B shows a cross-sectional view of process steps for making a contact formation using doped silicon in accordance with another embodiment of the invention.
Figure 9B:
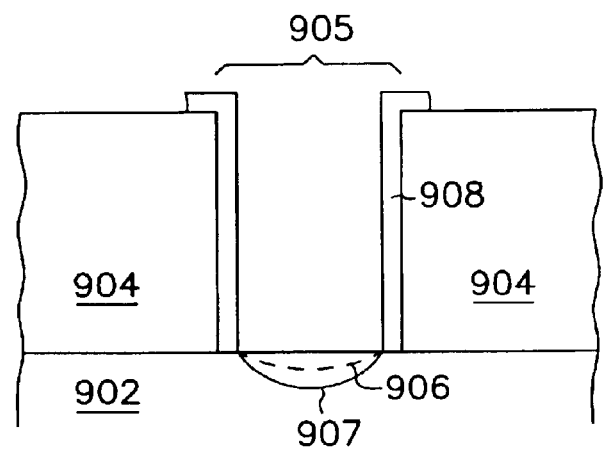

FIGS. 9A–9B illustrate generally the various processing techniques of another embodiment of a contact formation using doped silicon.

FIG. 9A illustrates the structure at the point where transistor fabrication has been completed up through covering source/drain regions with an insulator surface layer. This stage in the fabrication may be reached in a number of well known steps which do not comprise the thrust of the present invention. These processing steps are not repeated herein.

In FIG. 9A a surface layer 904 is shown on a substrate 902. The substrate 902 is an epitaxial layer suitable for integrated circuit manufacture. In one embodiment the substrate 902 is a P-type substrate with a boron background concentration on the order of $1\times10^{16}$ atoms/cm$^3$, a <100> orientation and a resistivity of 12 ohm-cm. The epitaxial surface layer of the substrate 902 is disposed on a P+ base layer (not shown) and includes a planar top surface. In an alternative embodiment, the substrate 902 is an N-type substrate on an N+ base layer. The surface layer 904 is an isolation layer and can be formed of any suitable dielectric material. In one embodiment, surface layer 904 is borophosphorus silicate glass (BPSG). A photoresist (not shown) is applied to the surface layer and selectively exposed to reveal the region where a contact is to be formed. The surface layer 904 is then removed from this region forming a contact opening 905. In one embodiment, the contact opening 905 is formed over a source/drain region of an IGFET. The surface layer 904 is removed by any suitable etching technique. In one embodiment, the surface layer 904 is removed using a wet etch process, such as a buffered oxide etch (BOE). In an alternative embodiment, the surface layer 904 is removed using a dry etch process, such as reactive ion etching (RIE). Next, an oxide layer 908 is formed on and within the contact opening 905. The oxide layer 908 can be formed using any suitable technique, such as by thermal growth or chemical vapor deposition. In one embodiment, the oxide layer 908 is formed from tetraethyl orthosilicate (TEOS) sources and the deposition is performed by low pressure chemical vapor deposition (LPCVD). The structure is now as appears in FIG. 9A.

FIG. 9B illustrates the structure following the final sequence of steps. The oxide layer 908 is selectively etched back from the substrate 902 using any suitable process, such as reactive ion etching (RIE). A germanium (Ge) contact 906 is deposited within the contact opening 906 and in the silicon substrate 902. The alloy material is deposited by an ion implantation method. Next, a high temperature rapid thermal anneal (RTA) is performed. As those skilled in the art will appreciate, this process cures out the crystal damage induced by the previous ion implantation process. Additionally, the annealing process forms an alloy 907 between the germanium (Ge) 906 and the silicon substrate 902. The structure is now as appears in FIG. 9B. Additional metallization layers and accompanying contact formation, not included here, are achieved using conventional techniques. These further processing steps are not repeated herein. Likewise, the principal processing steps disclosed herein may be combined with other steps apparent to those skilled in the art.

Figure 10:
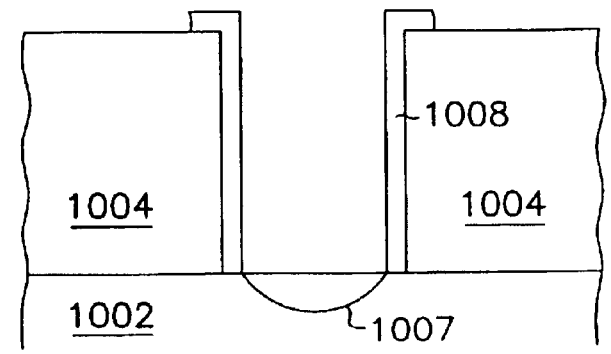
FIG. 10 illustrates the completed contact structure in accordance with another embodiment of the invention.

The present invention includes numerous variations to the embodiment described above. For instance, the completed device illustrated in FIG. 10 is one embodiment of the invention formed, according to the method of FIGS. 9A–9B on a top surface of a semiconductor substrate 1002. FIG. 10 is a cross sectional view wherein a surface layer 1004 is shown on a silicon substrate 1002 and a contact opening 1005 is formed within the surface layer 1004 on the substrate 1002. The surface layer 1004 is an isolation layer and can be formed of any suitable dielectric material. In one embodiment, surface layer 1004 is borophosphorus silicate glass (BPSG). An oxide layer 1008 is formed on and within the contact opening 1005. In one embodiment, the oxide layer 1008 is formed from a tetraethyl orthosilicate (TEOS) sources and formed by low pressure chemical vapor deposition (LPCVD). A germanium (Ge) contact is formed within the contact opening 1005 such that the germanium contact forms an alloy 1007 with the silicon substrate 1002.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. An information handling system comprising:
   a central processing unit;
   a random access memory;
   a system bus for communicatively coupling the central processing unit and the random access memory; and
   a conducting interface device comprising:
      a contact opening in a dielectric layer on a semiconductor substrate;
      an alloy material formed on the semiconductor substrate and within the contact opening in the dielectric layer;
      a continuous barrier metal formed over and adjoining walls of the contact opening and the alloy material; and
      a first contact material formed over the barrier metal.

2. The information handling system of claim 1, wherein the alloy material comprises silicon and germanium.

3. The information handling system of claim 1, wherein the barrier metal comprises:
   a layer of titanium (Ti); and
   a layer of titanium nitride (TiN) coupled to the layer of titanium (Ti).

4. The information handling system of claim 1, further comprising a transistor source/drain region in the semiconductor substrate wherein the contact opening opens to at least a portion of the transistor source/drain region.

5. A memory device, comprising:
   a number of access transistors, wherein a number of the access transistors include:
      a source/drain region formed in a semiconductor substrate;
      a conducting interface device coupled to the source/drain region, including:
         a contact opening in a dielectric layer over the source/drain region;
         an oxide layer on the dielectric layer, and within the contact opening in the dielectric layer; and
         an alloy material coupled to the source/drain region and coupled to the oxide layer within the contact opening.

6. The memory device of claim 5, wherein the alloy material includes silicon and germanium.

7. The memory device of claim 5, wherein the alloy material is formed on the source/drain region and within the contact opening by low temperature epitaxial deposition.

8. The memory device of claim 5, wherein the oxide layer includes tetraethyl orthosilicate (TEOS).

9. The memory device of claim 5, wherein the dielectric layer includes borophosphorus silicate glass (BPSG).

10. A memory device, comprising:
    a number of access transistors, wherein a number of the access transistors include:
       a source/drain region;
       a contact opening in a dielectric layer located substantially over the source/drain region;
       an alloy material formed over the source/drain region and within the contact opening in the dielectric layer;
       a continuous barrier metal formed within the contact opening in the dielectric layer, formed over and adjoining walls of the contact opening and the alloy material;
       a first contact material formed over the barrier metal; and
       a second contact material formed over the first contact material.

11. The memory device of claim 10, wherein the alloy material includes silicon and germanium.

12. The memory device of claim 10, wherein the barrier metal includes:
    a layer of titanium (Ti); and
    a layer of titanium nitride (TiN) coupled to the layer of titanium (Ti).

13. The memory device of claim 10, wherein the alloy material is formed on the source/drain region and within the contact opening by low temperature epitaxial deposition.

14. The memory device of claim 10, wherein the first contact material includes a refractory metal.

15. An information handling system comprising:
    a central processing unit;
    a memory device;
    a system bus for communicatively coupling the central processing unit and the memory device; and
    a conducting interface device comprising:
       a contact opening in a dielectric layer on a semiconductor substrate;
       an alloy material formed on the semiconductor substrate and within the contact opening in the dielectric layer;
       a continuous barrier metal formed within the contact opening in the dielectric layer, formed over and adjoining walls of the contact opening and the alloy material;
       a first contact material formed over the barrier metal; and
       a second contact material formed over the first contact material.

16. The information handling system of claim 15, wherein the alloy material includes silicon and germanium.

17. The information handling system of claim 15, wherein the barrier metal includes:
    a layer of titanium (Ti); and
    a layer of titanium nitride (TiN) coupled to the layer of titanium (Ti).

18. The information handling system of claim 15, wherein the alloy material is formed on the semiconductor substrate and within the contact opening by low temperature epitaxial deposition.

19. The information handling system of claim 15, wherein the first contact material includes a refractory metal.

20. The information handling system of claim 15, wherein the second contact material includes aluminum.

* * * * *

UNITED STATES PATENT AND TRADEMARK OFFICE
CERTIFICATE OF CORRECTION

PATENT NO. : 6,806,572 B2
DATED : October 19, 2004
INVENTOR(S) : Thakur

It is certified that error appears in the above-identified patent and that said Letters Patent is hereby corrected as shown below:

Title page,
Item [56], References Cited, OTHER PUBLICATIONS, "Aubrey, V.., et al.," reference delete "Aubrey" and insert -- Aubry --, therefor.
"Srider, D., et al.," reference, delete "Technology" and insert -- Technology --, therefor.

Signed and Sealed this

Twenty-sixth Day of April, 2005

JON W. DUDAS
*Director of the United States Patent and Trademark Office*